US012616074B2

(12) United States Patent
Bu et al.

(10) Patent No.: US 12,616,074 B2
(45) Date of Patent: Apr. 28, 2026

(54) DOUBLE-SIDED COOLING PACKAGE FOR DOUBLE-SIDED, BI-DIRECTIONAL JUNCTION TRANSISTOR

(71) Applicant: IDEAL POWER INC., Austin, TX (US)

(72) Inventors: Jiankang Bu, Austin, TX (US); Robert Daniel Brdar, Driftwood, TX (US)

(73) Assignee: IDEAL POWER INC., Austin, TX (US)

( * ) Notice: Subject to any disclaimer, the term of this patent is extended or adjusted under 35 U.S.C. 154(b) by 409 days.

(21) Appl. No.: 18/321,210

(22) Filed: May 22, 2023

(65) Prior Publication Data

US 2023/0386987 A1     Nov. 30, 2023

Related U.S. Application Data

(60) Provisional application No. 63/345,711, filed on May 25, 2022.

(51) Int. Cl.
*H10W 90/00*          (2026.01)
*H10W 40/25*          (2026.01)
          (Continued)

(52) U.S. Cl.
CPC ....... *H10W 90/401* (2026.01); *H10W 40/255* (2026.01); *H10W 90/00* (2026.01);
          (Continued)

(58) Field of Classification Search
CPC ........... H01L 23/49833; H01L 23/3735; H01L 24/29; H01L 24/32; H01L 24/33; H01L 24/83; H01L 25/0655; H01L 25/115;

H01L 25/117; H01L 23/3121; H01L 24/06; H01L 2224/06181; H01L 2224/29139; H01L 2224/32225; H01L 2224/33181; H01L 2224/83191; H01L 2224/83424; H01L 2224/83447; H01L 2224/8384; H01L 2924/20108; H01L 23/3677; H01L 23/433;
          (Continued)

(56)          References Cited

U.S. PATENT DOCUMENTS

| | | |
|---|---|---|
| 7,220,661 B1 | 5/2007 | Yu et al. |
| 10,211,133 B2 | 2/2019 | Grassmann et al. |
| (Continued) | | |

OTHER PUBLICATIONS

International Search Report and Written Opinion mailed Sep. 8, 2023 for International Application No. PCT/US2023/023069, 11 pages.

*Primary Examiner* — Patricia D Valenzuela
(74) *Attorney, Agent, or Firm* — Dickinson Wright PLLC

(57)          ABSTRACT

A double-sided cooling package for a double-sided, bi-directional junction transistor can include a double-sided, bi-directional, junction transistor chip with an individual, double-sided, bi-directional power switch (collectively, a DSTA). The DSTA can be sandwiched between heat sinks. Each heat sink can include a direct plating copper (DPC) structure, a direct copper bonding (DCB) structure or a direct aluminum bond (DAB) structure. In addition, each heat sink can have opposed first and second copper layers on a substrate, and copper contacts that extend from a respective second copper layer through vias in each substrate to an exterior of the cooling package.

25 Claims, 6 Drawing Sheets

21

(51) Int. Cl.

| | |
|---|---|
| *H10W 72/00* | (2026.01) |
| *H10W 72/30* | (2026.01) |
| *H10W 72/90* | (2026.01) |
| *H10W 74/10* | (2026.01) |

(52) U.S. Cl.
CPC .... *H10W 72/073* (2026.01); *H10W 72/07331* (2026.01); *H10W 72/07354* (2026.01); *H10W 72/347* (2026.01); *H10W 72/352* (2026.01); *H10W 72/944* (2026.01); *H10W 72/952* (2026.01); *H10W 74/114* (2026.01); *H10W 90/734* (2026.01)

(58) Field of Classification Search
CPC . H10W 90/401; H10W 40/255; H10W 90/00; H10W 72/073; H10W 72/07331; H10W 72/07354; H10W 72/347; H10W 72/352; H10W 72/944; H10W 72/952; H10W 74/114; H10W 90/734; H10W 40/77; H10W 40/228; H10W 72/30
See application file for complete search history.

(56) References Cited

U.S. PATENT DOCUMENTS

| | | | |
|---|---|---|---|
| 10,374,070 | B2 | 8/2019 | Wood |
| 11,211,373 | B1 | 12/2021 | Bhalla et al. |
| 2004/0188706 | A1* | 9/2004 | Chang ..................... H01L 24/49 |
| | | | 257/155 |
| 2008/0013351 | A1 | 1/2008 | Alexander |
| 2008/0031019 | A1 | 2/2008 | Alexander |
| 2010/0067272 | A1 | 3/2010 | Alexander |
| 2011/0292697 | A1 | 12/2011 | Alexander |
| 2012/0008353 | A1 | 1/2012 | Alexander |
| 2012/0014151 | A1 | 1/2012 | Alexander |
| 2012/0020129 | A1 | 1/2012 | Alexander |
| 2012/0033464 | A1 | 2/2012 | Alexander |
| 2012/0051100 | A1 | 3/2012 | Alexander |
| 2012/0268975 | A1 | 10/2012 | Alexander |
| 2012/0274138 | A1 | 11/2012 | Bundschuh et al. |
| 2012/0279567 | A1 | 11/2012 | Alexander |
| 2013/0038129 | A1 | 2/2013 | Bundschuh et al. |
| 2013/0062656 | A1 | 3/2013 | Lee et al. |
| 2013/0063988 | A1 | 3/2013 | Alexander |
| 2013/0063994 | A1 | 3/2013 | Alexander |
| 2013/0069605 | A1 | 3/2013 | Alexander |
| 2013/0114303 | A1 | 5/2013 | Bundschuh et al. |
| 2013/0114311 | A1 | 5/2013 | Alexander |
| 2013/0114315 | A1 | 5/2013 | Alexander |
| 2013/0114316 | A1 | 5/2013 | Alexander |
| 2013/0307336 | A1 | 11/2013 | Bundschuh et al. |
| 2013/0314096 | A1 | 11/2013 | Bundschuh et al. |
| 2014/0029320 | A1 | 1/2014 | Alexander |
| 2014/0036554 | A1 | 2/2014 | Alexander |
| 2014/0133203 | A1 | 5/2014 | Alexander |
| 2014/0319911 | A1 | 10/2014 | Alexander |
| 2014/0334103 | A1 | 11/2014 | Schulz-Harder et al. |
| 2014/0368038 | A1 | 12/2014 | Alexander |
| 2014/0375287 | A1 | 12/2014 | Blanchard et al. |
| 2014/0376291 | A1 | 12/2014 | Blanchard et al. |
| 2015/0003115 | A1 | 1/2015 | Barron et al. |
| 2015/0029769 | A1 | 1/2015 | Blanchard et al. |
| 2015/0054552 | A1 | 2/2015 | Blanchard et al. |
| 2015/0061569 | A1 | 3/2015 | Alexander et al. |
| 2015/0061732 | A1 | 3/2015 | Blanchard et al. |
| 2015/0214055 | A1 | 7/2015 | Blanchard et al. |
| 2015/0214299 | A1 | 7/2015 | Blanchard |
| 2015/0214782 | A1 | 7/2015 | Alexander |
| 2015/0214784 | A1 | 7/2015 | Alexander |
| 2015/0222146 | A1 | 8/2015 | Alexander |
| 2015/0222147 | A1 | 8/2015 | Alexander |
| 2015/0222194 | A1 | 8/2015 | Bundschuh |
| 2015/0270771 | A1 | 9/2015 | Alexander et al. |
| 2015/0270837 | A1 | 9/2015 | Alexander et al. |
| 2015/0280613 | A1 | 10/2015 | Alexander et al. |
| 2015/0288358 | A1 | 10/2015 | Alexander et al. |
| 2015/0303915 | A1 | 10/2015 | Alexander et al. |
| 2015/0311777 | A1 | 10/2015 | Alexander et al. |
| 2015/0318704 | A1 | 11/2015 | Barron et al. |
| 2016/0005675 | A1 | 1/2016 | Tong |
| 2016/0006430 | A1 | 1/2016 | Alexander et al. |
| 2016/0072400 | A1 | 3/2016 | Alexander |
| 2016/0322350 | A1 | 11/2016 | Blanchard |
| 2016/0322484 | A1 | 11/2016 | Blanchard |
| 2016/0344300 | A1 | 11/2016 | Alexander |
| 2016/0351399 | A1 | 12/2016 | Blanchard et al. |
| 2017/0047922 | A1 | 2/2017 | Alexander |
| 2017/0085179 | A1 | 3/2017 | Alexander et al. |
| 2017/0104478 | A1 | 4/2017 | Alexander et al. |
| 2017/0126225 | A1 | 5/2017 | Alexander et al. |
| 2017/0162481 | A1* | 6/2017 | Lin .................. H01L 23/49568 |
| 2017/0271328 | A1 | 9/2017 | Alexander |
| 2017/0288561 | A1 | 10/2017 | Lemberg et al. |
| 2017/0317575 | A1 | 11/2017 | Alexander |
| 2018/0026122 | A1 | 1/2018 | Blanchard et al. |
| 2018/0109101 | A1 | 4/2018 | Alexander |
| 2018/0130898 | A1 | 5/2018 | Blanchard et al. |
| 2018/0219061 | A1 | 8/2018 | Alexander et al. |
| 2018/0226254 | A1 | 8/2018 | Blanchard et al. |
| 2019/0088645 | A1 | 3/2019 | Alexander |
| 2019/0097031 | A1 | 3/2019 | Alexander et al. |
| 2019/0140548 | A1 | 5/2019 | Alexander |
| 2019/0267810 | A1 | 8/2019 | Johns |
| 2020/0006945 | A1 | 1/2020 | Lemberg et al. |
| 2020/0058780 | A1 | 2/2020 | Alexander et al. |
| 2020/0111672 | A1 | 4/2020 | Blanchard et al. |
| 2020/0243674 | A1 | 7/2020 | Alexander et al. |
| 2021/0313461 | A1 | 10/2021 | Blanchard et al. |
| 2021/0359678 | A1 | 11/2021 | Mojab |
| 2021/0384900 | A1 | 12/2021 | Mojab |
| 2022/0077852 | A1 | 3/2022 | Mojab |
| 2022/0157974 | A1 | 5/2022 | Blanchard et al. |
| 2022/0190115 | A1 | 6/2022 | Mojab et al. |
| 2023/0048984 | A1 | 2/2023 | Bu et al. |
| 2023/0066664 | A1 | 3/2023 | Wood et al. |

\* cited by examiner

DOUBLE-SIDED COOLING PACKAGE FOR DOUBLE-SIDED, BI-DIRECTIONAL JUNCTION TRANSISTOR

CROSS-REFERENCE TO RELATED APPLICATIONS

This application claims the benefit of U.S. Provisional App. No. 63/345,711 filed May 25, 2022. The provisional application is incorporated by reference herein as if reproduced in full below.

TECHNICAL FIELD

This application generally relates to cooling packages for integrated circuit devices and, in particular, to a double-sided cooling package for a double-sided, bi-directional junction transistor.

BACKGROUND

Ideal Power Inc. of Austin, Texas, assignee of the current application, owns U.S. Pat. Nos. 9,029,909, 9,059,710 and 9,035,350. Those patents disclose double-sided, bi-directional, junction transistors, with an individual double-sided bi-directional power switch. Such products offer substantial performance improvements over conventional power semiconductors, such as low, on-state, collector-emitter voltage drop (VCEon), oscillation free turn off, and ultra-low switching loss.

After complete wafer fabrication, the product needs to be packaged so it can be used as a discrete power device, a co-packed power device, or a multi-chip power module. Traditional packages, such as TO, flip flop, etc., do not work well for this type of product. Thus, improvements in cooling packages continue to be of interest.

SUMMARY

Embodiments of a system, method and apparatus for a double-sided cooling package for a double-sided, bi-directional junction transistor are disclosed. For example, a cooling package for double-sided chips can include a double-sided, bi-directional, junction transistor chip with an individual, double-sided, bi-directional power switch (collectively, a double-sided transistor assembly (DSTA). The DSTA can be sandwiched between heat sinks. Each heat sink can include a direct plating copper (DPC) structure, a direct copper bonding (DCB) structure or a direct aluminum bond (DAB) structure, in some versions. In addition, each heat sink can have opposed first and second copper layers on a substrate, and copper contacts that extend from a respective second copper layer through vias in each substrate to an exterior of the cooling package.

In other embodiments, a method of soldering a transistor can include providing a double-sided, bi-directional, junction transistor chip, or double-sided transistor assembly (DSTA); mounting the DSTA in a die; print sintering Ag on first side pads of the DSTA; aligning a first side layer of a first heat sink to match a pattern of the first side pads on the DSTA; sintering the sintering Ag to convert the sintering Ag to pure Ag; and then inverting the die and repeating these steps on second side pads of the DSTA and a second heatsink.

BRIEF DESCRIPTION OF THE DRAWINGS

For a detailed description of example embodiments, reference will now be made to the accompanying drawings in which.

DETAILED DESCRIPTION

Figure 1:
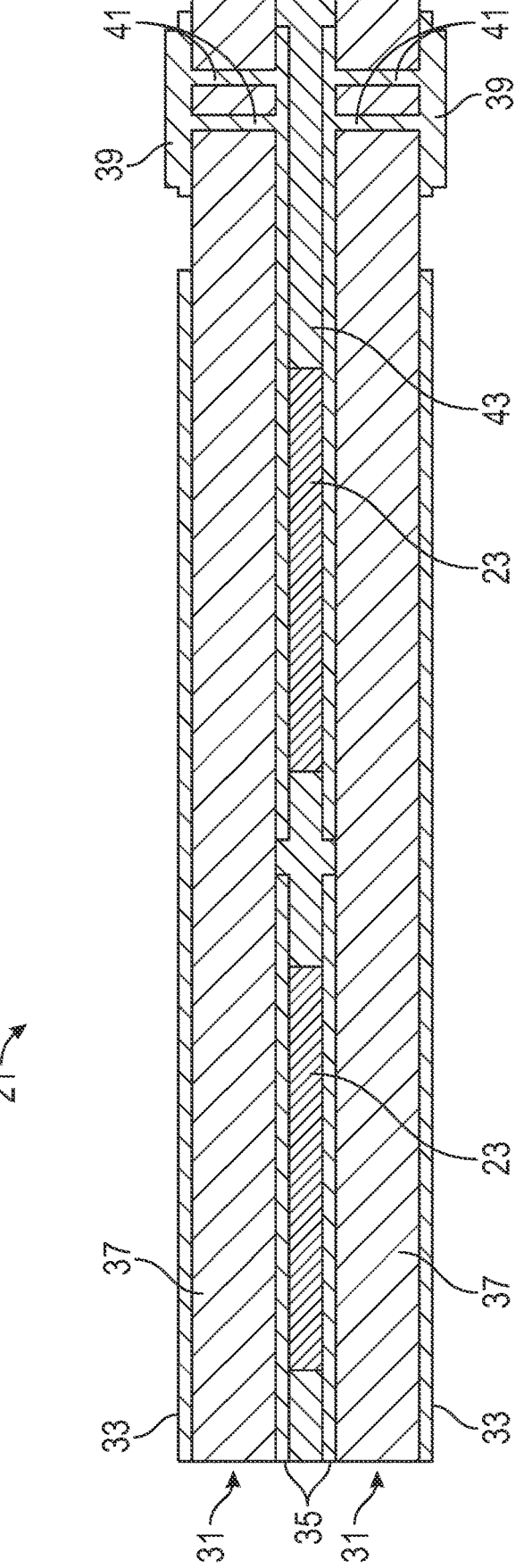
FIG. 1 is a sectional side view of an embodiment of a cooling package for transistors.

FIGS. 1-10 depict various embodiments of a cooling package 21 for a double-sided transistor. For example, the cooling package 21 can include at least one double-sided, bi-directional, junction transistor chip with an individual, double-sided, bi-directional power switch (collectively, a double-sided transistor assembly (DSTA) 23; e.g., four shown in FIG. 2). The DSTA 23 can be symmetrical on both sides. The DSTA 23 can be sandwiched between heat sinks 31. Each heat sink 31 can include a direct plating copper (DPC) structure having opposed first and second copper layers 33, 35 on a substrate 37. The heat sink 31 also can have copper contacts 39 (FIG. 1) that extend from a respective second copper layer 35 through vias 41 in each substrate 37 to an exterior of the cooling package 21.

Embodiments of the cooling package 21 can comprise a multi-chip power module (FIG. 2), a discrete power device (FIGS. 3-4), or a co-packed power device (different devices packed together, such as IGBT+diode), as examples. As noted above, the cooling package 21 can further comprise a second DSTA 23 that is identical to the DSTA 23, packaged side-by-side with the DSTA, and is sandwiched between the heat sinks 31. The cooling package 21 also can further comprise additional DSTA 23 (similar to FIG. 2) that are identical to the DSTA 23. They can be packaged side-by-side and are sandwiched between the heat sinks 31.

Figures 5, 6:
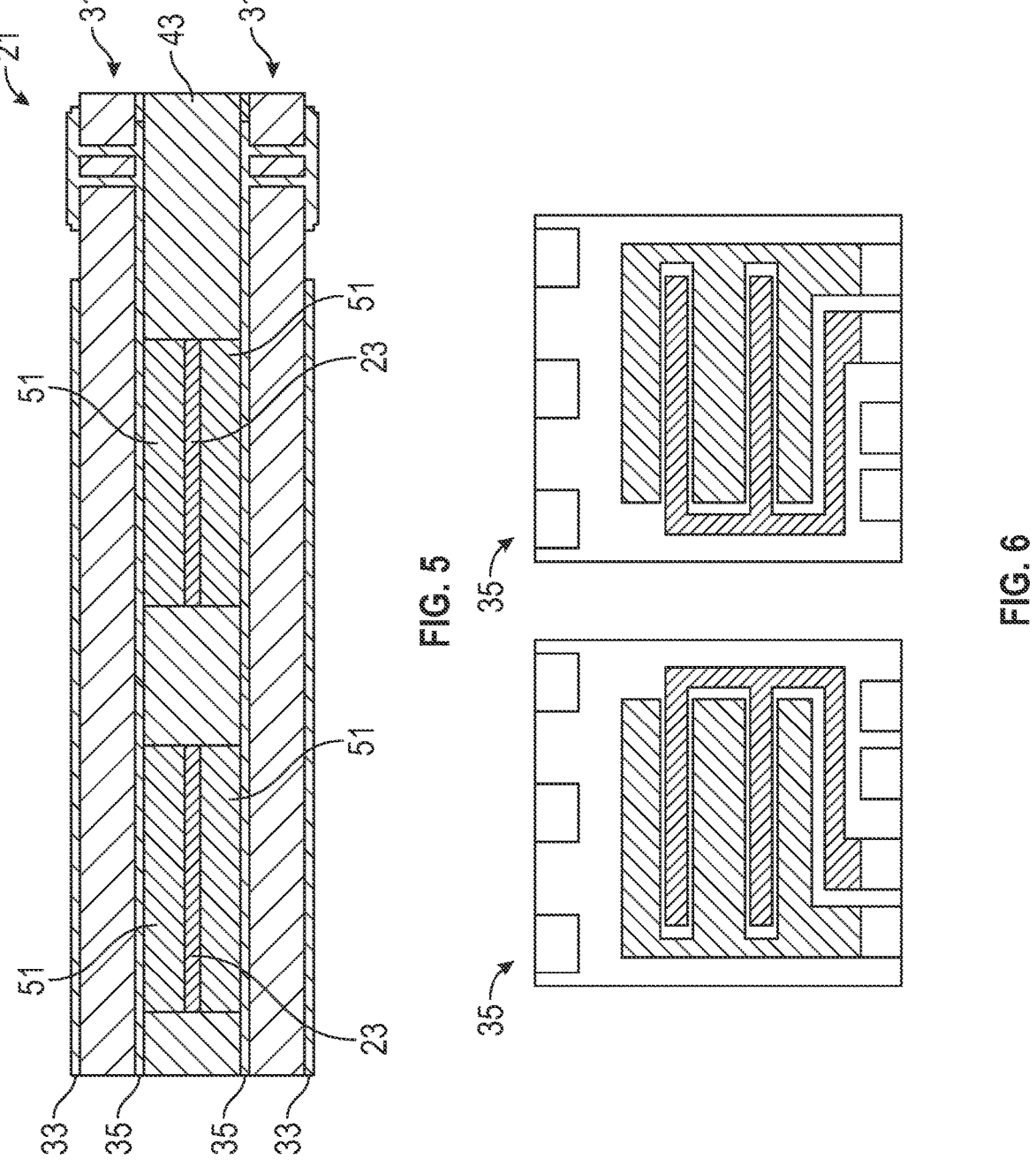
FIG. 5 is a sectional side view of another embodiment of a cooling package for transistors.
FIG. 6 is a plan view of embodiments of DPC structures with patterns.

Versions of the cooling package 21 can further comprise asymmetrical temperature soldering on each side of the cooling package 21. For example, a first solder can be applied on one side and can have a higher melting temperature than a second solder applied on an opposite side after the first solder. The first and second solder each can comprise Ag, in some versions. As shown in FIG. 5, one embodiment of the cooling package 21 can comprise sintering Ag 51 to bond each DSTA 23 to a respective heat sink 31. The sintering Ag 51 can be converted to pure Ag during sintering. Each layer of pure Ag can comprise a thickness of at least 1 mm to facilitate leads between inner planes of the respective heat sinks 31.

Embodiments of the DSTA 23 can be configured to operate at an electrical current of at least 50 A with a parasitic resistance from the cooling package 21 of less than 1 mOhm up to 100 kHz switching frequency. The DSTA 23 can be configured to operate at a power of more than 60 kW. Versions of the DSTA 23 can comprise a wafer thickness in a range of 40 um to 750 um.

Figure 7:
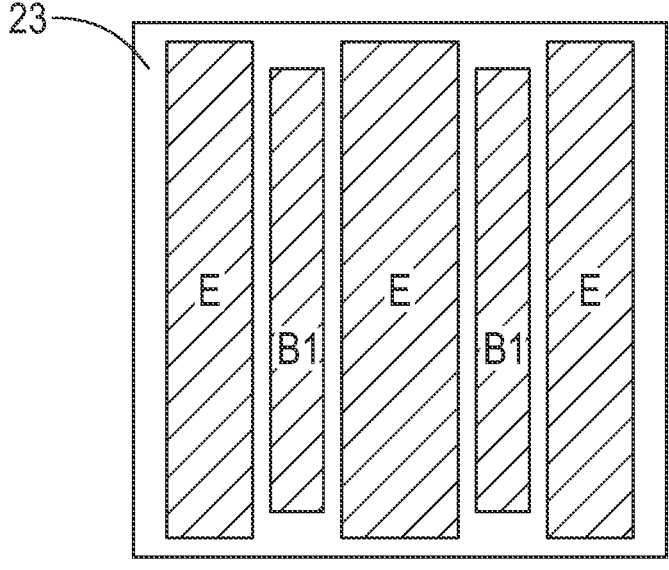
FIG. 7 is a plan view of an embodiment of a pattern for a DSTA.

Referring again to FIG. 2, the opposed first and second copper layers 33, 35 of each DPC structure can comprise a solid copper outer layer (e.g., the first copper layer 33) on a respective substrate 37, and a patterned copper inner layer (e.g., the second copper layer 35) opposite the solid copper outer layer 33. The patterned copper inner layer 35 can match a pattern of a respective one of the DSTA 23. Examples of the patterns are shown in FIGS. 6-7, such as with emitter areas (E) and base areas (B1).

Each copper layer 33, 35 of the DPC structures can comprise a thickness in a range of about 1 um to about 150 um to be compatible with various current flowing through the copper, in some versions. Alternatively, each copper layer 33, 35 of the DPC structure can comprise a thickness in a range of greater than 75 um to about 150 um. The overall thickness of the entire cooling package 21 can be compatible with any wafer thickness currently in volume production, ranging from about 45 um to about 750 um. Even thinner wafer thicknesses can be accommodated, for example, less than 45 um. This is one advantage of the DPC design: it allows routing to the outer copper layer 33 through one or more vias 41, so the wafer thickness is not a limitation for the bi-directional power switch with a double-sided cooling package 21.

Figure 8:
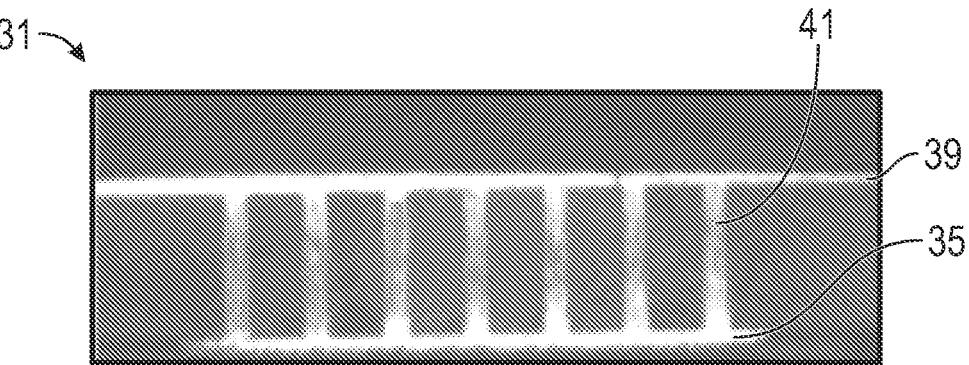
FIG. 8 is an optical microscope image of an embodiment of line width/spacing for a DPC substrate.
Figure 9:
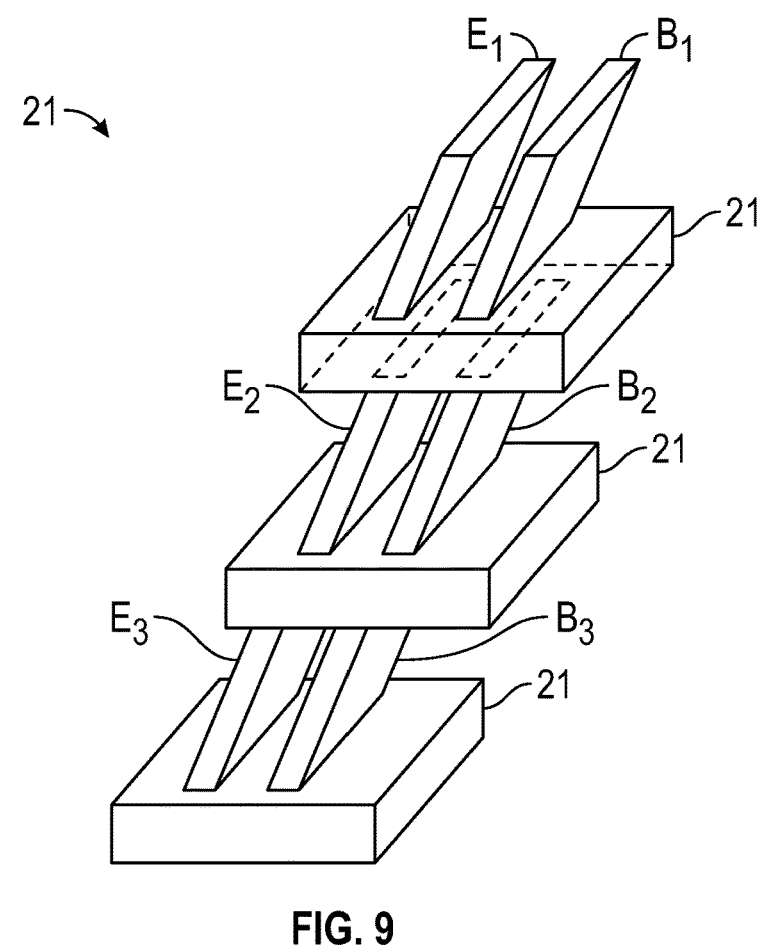
FIG. 9 is a schematic diagram of an embodiment of modules in a series mode.
Figure 10:
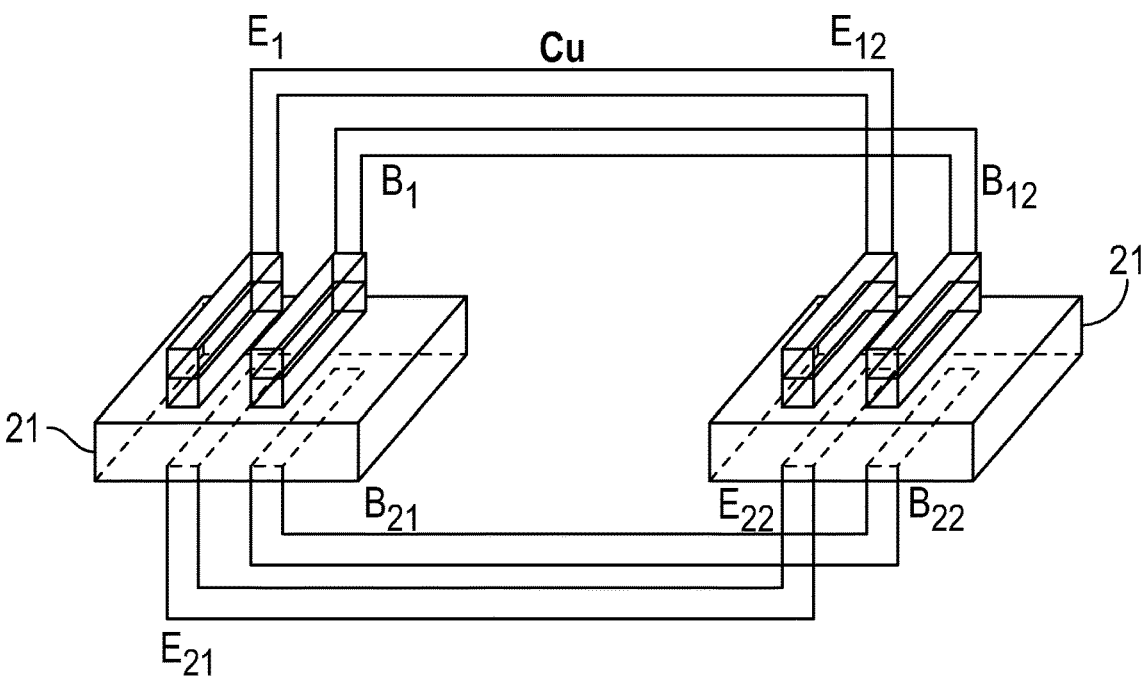
FIG. 10 is a schematic diagram of an embodiment of modules in a parallel mode.

In some embodiments, the substrate 37 of the DPC structure can comprise at least one of $Al_2O_3$, ZTA, AlN, silicon, BeO or other materials that have high electrical resistance, and low thermal resistance, i.e., which contributes to reduced electrical impedance and allows enhanced thermal conductance. The DPC structure can comprise a thermal resistance of about 0.001° C./watt to about 0.1° C./watt, in some examples. The cooling package 21 can further comprising molding compound or epoxy encapsulation 43 between the DPC structures and surrounding the DSTA 23. As shown in FIG. 8, each DPC structure can comprise a line pitch with line width/line space resolution as fine as 2 mil/2 mil. Each via 41 in each substrate 37 can comprise a diameter in a range of not less than 25 um to 150 um, in some versions.

Embodiments of the cooling package 21 can further comprise a second cooling package 21, and each cooling package 21 can comprise a micro-module. The cooling package 21 can further comprise a plurality of cooling packages 21 stacked in series together (FIG. 9) with emitter areas E1, E2 and E3, and base areas B1, B2 and B3, to expand blocking voltage. For example, four 1200 V micro-modules can stack together to accommodate 4800 V blocking voltage. In another example, the cooling package 21 can further comprise a plurality of cooling packages 21 that are configured to operate in parallel (FIG. 10) with emitter areas E1, E12, E21, E22, and base areas B1, B12, B21, B22, to expand operational current (e.g., four 100 A micro-modules in parallel together can accommodate 400 A of electrical current.

Another version of the cooling package 21 can include a double-sided, bi-directional, junction transistor chip with an individual, double-sided, bi-directional power switch (collectively, a DSTA 23) sandwiched between heat sinks 31. Each heat sink 31 can comprise a direct copper bonding (DCB) structure having opposed first and second copper layers 33, 35 on a substrate 27. Copper contacts 39 can extend from a respective second copper layer 35 through vias 41 in each substrate 37 to an exterior of the cooling package 21.

Figure 2:
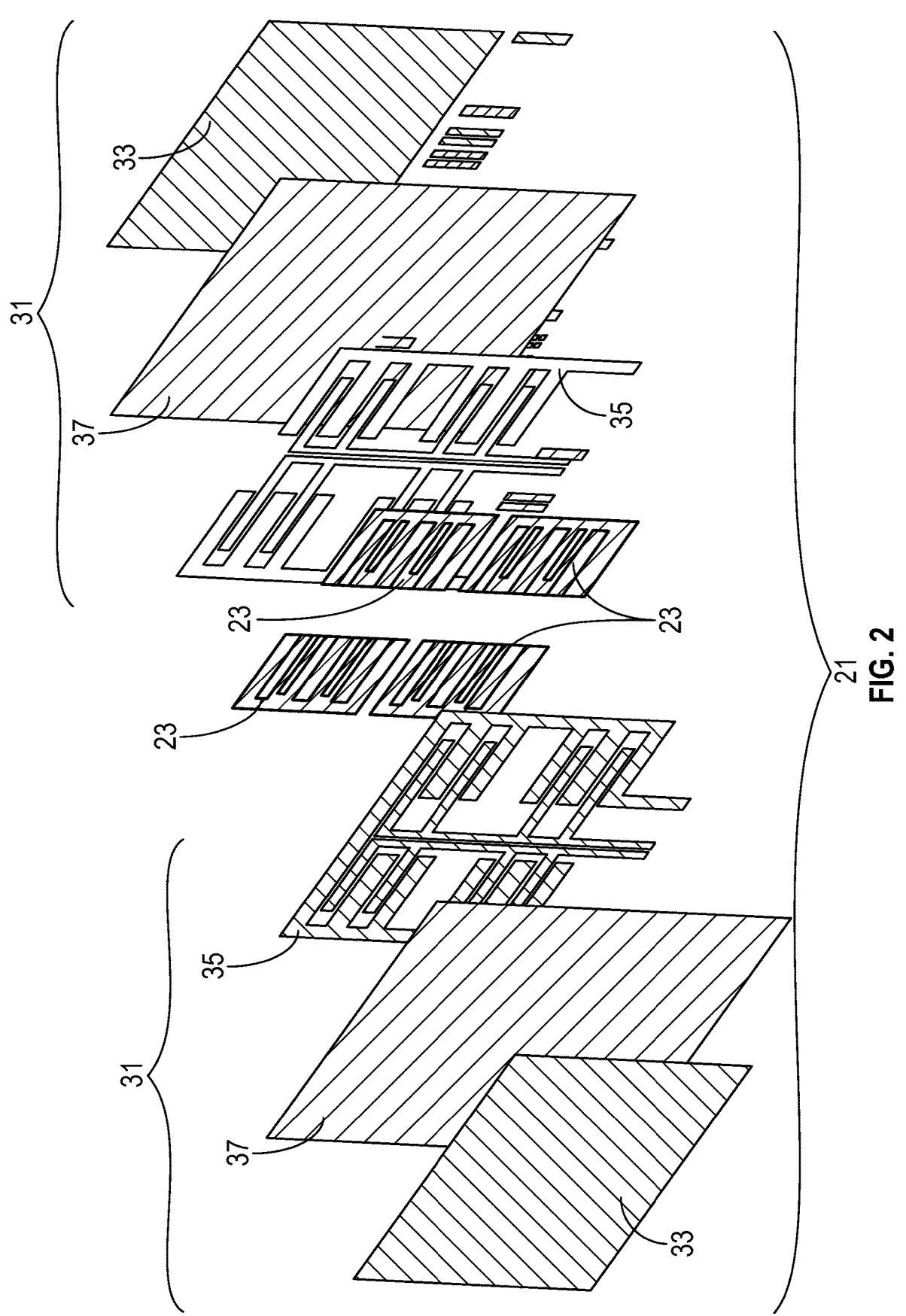
FIG. 2 is an exploded view of the embodiment of FIG. 1.
Figure 3:
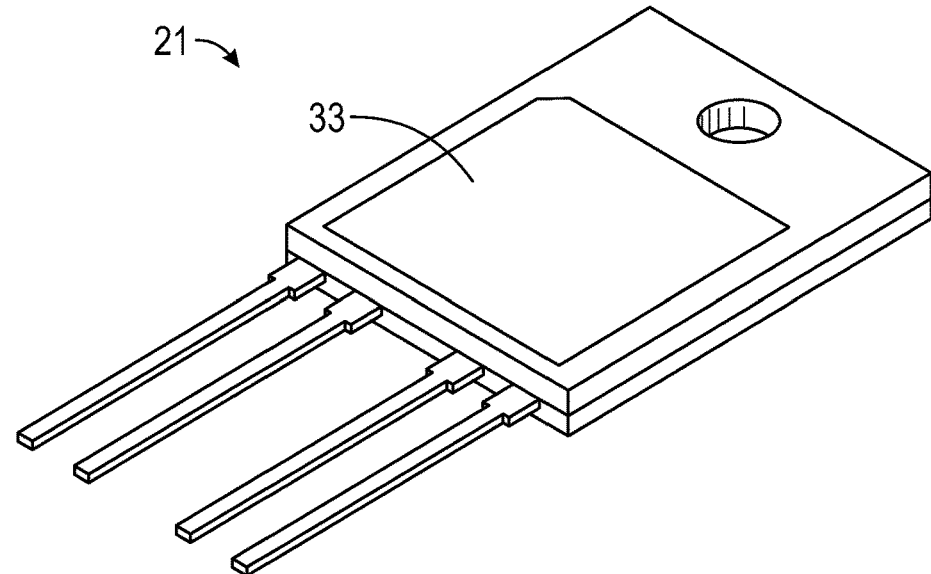
FIG. 3 is a perspective view of an embodiment of a discrete package.
Figure 4:
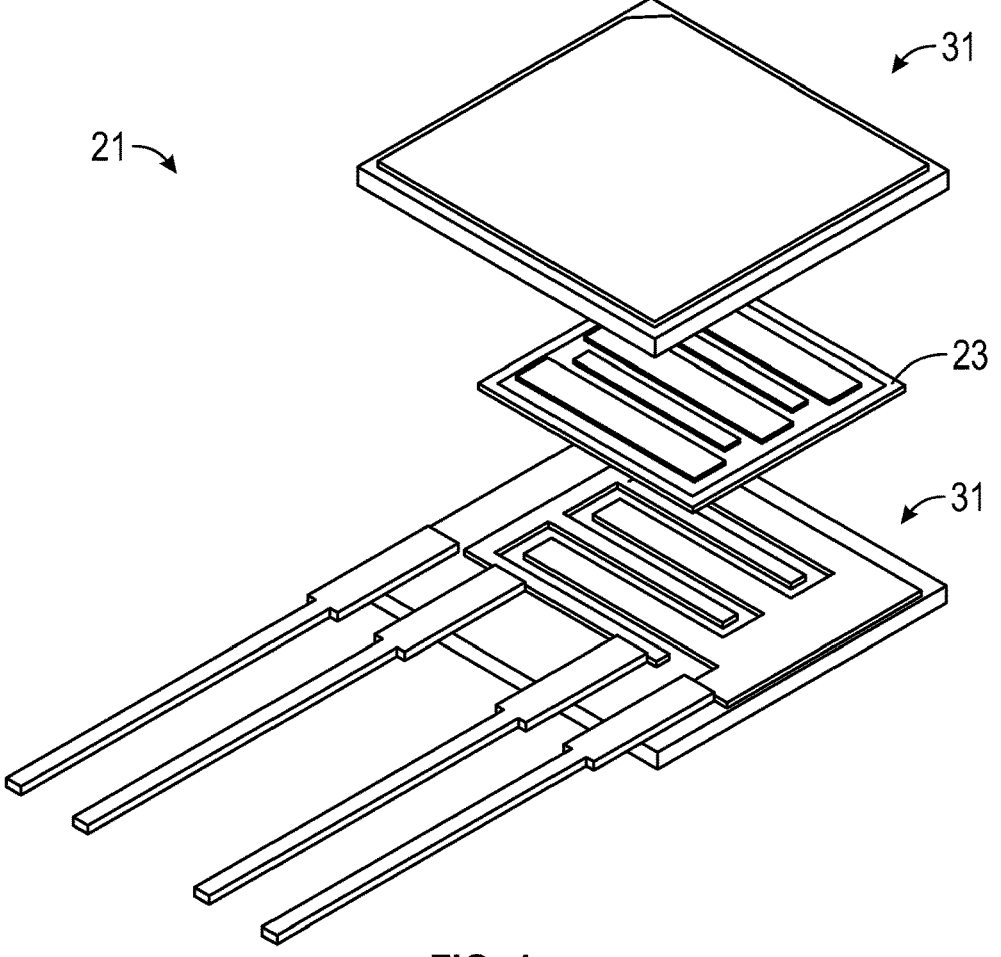
FIG. 4 is an exploded view of the embodiment of FIG. 3.

Still another version of the cooling package 21 can include one or more heat sinks 31 that comprise a direct aluminum bond (DAB) structure having opposed first and second aluminum layers (which are analogous to first and second copper layers 33, 35) on a substrate (which is analogous to substrate 37; similar to FIG. 2). Aluminum contacts (which are analogous to copper contacts 39) can extend from a respective second aluminum layer through vias (which are analogous to vias 41) in each substrate to an exterior of the cooling package 21.

A method of soldering a transistor also is contemplated. For example, the method can include providing a double-sided, bi-directional, junction transistor chip (DSTA); mounting the DSTA in a die; print sintering Ag on first side pads of the DSTA; aligning a first side layer of a first heat sink to match a pattern of the first side pads on the DSTA; sintering the sintering Ag to convert the sintering Ag to pure Ag; and then inverting the die and repeating these steps on second side pads of the DSTA and a second heatsink. In some embodiments, each heat sink can comprise a direct plating copper (DPC) structure, a direct copper bonding (DCB) structure or a direct aluminum bond (DAB) structure.

When combined with a package as described herein, the DSTA can have many advantages. For example, both sides of DSTA can operate at high power with heat sinks on both sides of the DSTA. DSTA has symmetrical structures on both sides. Package materials and performance also are symmetrical. In contrast, a traditional TO package has one side as a lead frame with a heat sink, and the other side is molding compound. The DSTA chip is thin compared to traditional 500 um or 750 um chip. The novel, double-sided cooling packages disclosed herein help fulfil the potential of DSTA, meet DSTA unique structural requirements, and can improve DSTA performance. Other benefits and advantages can include:

double-sided cooling of DSTA, both as discrete and multichip power modules.
   DSTA double-sided cooling with direct bonding copper (DBC).
   DSTA double-sided cooling with direct aluminum bond (DAB).
   DSTA double-sided cooling with Direct Plating Copper (DPC).
   High power on both sides.
   Symmetrical, reduced thermal resistance, reduced electrical impedance, higher reliability.
   DSTA double-sided cooling with asymmetrical soldering, i.e., soldering temperature of first solder, such as tin (Sn) soldering, is higher than second solder on the opposite side, such as SAC305. Thus, the second soldering does not loosen the first soldering.
   DSTA double-sided cooling with sintering silver (Ag) to eliminate asymmetrical soldering issue in a double-sided cooling package. Both sides can use sintering Ag. After converting to pure Ag, the second soldering temperature's impact to the first Ag soldering is negligible.
   Friendly connection to outside heat sink.
   A package technology, Direct Plating Copper (DPC), has overcome drawbacks in the prior art and, further, provide high resolution, high reliable, high thermal and electrical performance. DPC substrates have several advantages, including the following.
   Fine line pitch, such as line width/spacing at 2/2 mil in MP, or finer.
   The via size is small, such as a diameter of 25 um, and can comprise high conductivity copper plating.
   The copper thickness can be in a range of 1 um to about 150 um, such as 50 um to 75 um.
   Excellent thermal conductivity.

Very high electrical isolation.

Low electrical capacitance.

Very high pattern accuracy.

High design flexibility.

Through-vias can connect the front and back sides of the DPC substrate. Via design can create high density circuits and conduct more heat.

Circuitry can be formed on $Al_2O_3$, ZTA, AlN, BeO and various substrates.

Various surface finishing options include: electroless Ag, ENEPIG, ENIG, electrolytic Ni/Ag, electrolytic Ni/Au and electrolytic Ni/Pd/Au.

The DPC-based, double-sided cooling design and manufacturing method can match the DSTA symmetrical structure, conduct high electrical current in both sides with improved thermal resistivity and electrical impedance, symmetrical soldering, etc., to improve the DSTA performance.

A representative, multi-chip structure can include a DPC-based, double-sided DSTA cooling package. The DSTA chips can be sandwiched between a top DPC and a bottom DPC. Leads or pins can connect to DSTA chip pads through vias in a symmetrical pattern, in one example.

Traditionally, the soldering of the top side is different from the bottom side, which can lead to asymmetrical performance and increase process complexity. To solve this issue, sintering Ag technology, such as Argomax Ag, can be used to solder the DSTA chip with the DPC's copper pattern.

The sintering temperature of Ag is <300° C., to form pure Ag. However, the melting point of Ag is 962° C. This can solve the asymmetrical soldering issues in a double-sided cooling package. An exemplary procedure for DSTA double-sided cooling soldering can include: print sintering Ag on DSTA front side pads, align top side DPC to the DSTA patterns, sintering at 300° C. to convert sintering Ag to pure Ag. The pure Ag bonds the DSTA pads with the top DPC firmly, and will not melt or loosen until 962° C. The die can then be inverted and these steps are repeated on the bottom side with sintering Ag. Because the sintering temperature (300° C.) is well below the melting point of the Ag (962° C.) on the front side, the bottom side soldering process impact on the front side post-soldering structure is negligible.

Further, comparing to traditional SAC or lead solder, sintering Ag has more than 10× lower electrical resistance, and more than 7× higher thermal conductivity. This increases the power dissipation of the package, lowers DSTA chip junction temperature, thus improving reliability, and further reduces extra impedance from the package.

The Cu layer on the DPC can be patterned to match the DSTA chip pattern. Using one chip as an example, the Cu pattern on the top DPC and the bottom DPC can match the DSTA chip pattern.

With appropriate lead connections, the same DPC double-sided cooling package can be manufactured to be a discrete package, such as TO264. The DSTA chip can be on the top and bottom DPC with two leads attached to the bottom DPC Cu that are connected to the DSTA bottom E, B pads. Two extra leads positions are left for the top DPC, and can be connected to the DSTA top E, B pads.

Other embodiments can include one or more of the following items.

1. A cooling package for double-sided chips, the cooling package comprising:

a double-sided, bi-directional, junction transistor chip with an individual, double-sided, bi-directional power switch, or double-sided transistor assembly (collectively, a DSTA) sandwiched between heat sinks, each heat sink comprising a direct plating copper (DPC)

structure having opposed first and second copper layers on a substrate, and copper contacts that extend from a respective second copper layer through vias in each substrate to an exterior of the cooling package.

2. The cooling package wherein the cooling package comprises one of a discrete power device, co-packed power device or multi-chip power module.

3. The cooling package further comprising a second DSTA that is identical to the DSTA, packaged side-by-side with the DSTA, and is sandwiched between the heat sinks.

4. The cooling package further comprising second, third and fourth DSTA that are identical to the DSTA, are packaged side-by-side with the DSTA, and are sandwiched between the heat sinks.

5. The cooling package wherein the DSTA is symmetrical on both sides.

6. The cooling package further comprising asymmetrical temperature soldering on each side of the cooling package, wherein a first solder that is applied on one side has a higher melting temperature than a second solder applied on an opposite side after the first solder.

7. The cooling package wherein the first and second solder each comprise Ag.

8. The cooling package further comprising sintering Ag to bond each DSTA to a respective heat sink, and wherein the sintering Ag is converted to pure Ag during sintering.

9. The cooling package wherein each layer of pure Ag comprises a thickness of at least 1 mm to facilitate leads between inner planes of the respective heat sinks.

10. The cooling package wherein the DSTA is configured to operate at an electrical current of at least 50 A with a parasitic resistance from the cooling package of less than 1 mOhm up to 100 kHz switching frequency.

11. The cooling package wherein the DSTA is configured to operate at a power of more than 60 kW.

12. The cooling package wherein the DSTA comprises a wafer thickness in a range of 40 um to 750 um.

13. The cooling package wherein the opposed first and second copper layers of each DPC structure comprises a solid copper outer layer on a respective substrate, and a patterned copper inner layer opposite the solid copper outer layer.

14. The cooling package wherein the patterned copper inner layer matches a pattern of a respective one of the DSTA.

15. The cooling package wherein each copper layer of the DPC structures comprises a thickness in a range of about 1 um to about 150 um to be compatible with various current flowing through the copper.

16. The cooling package wherein each copper layer of the DPC structure comprises a thickness in a range of greater than 75 um to about 150 um.

17. The cooling package wherein the substrate of the DPC structure comprises at least one of $Al_2O_3$, ZTA, AlN, silicon or BeO.

18. The cooling package wherein the DPC structure comprises a thermal resistance of about 0.001° C./watt to about 0.1° C./watt.

19. The cooling package further comprising molding compound or epoxy encapsulation between the DPC structures and surrounding the DSTA.

20. The cooling package wherein each DPC structure comprises a line pitch with line width/line space resolution as fine as 2 mil/2 mil.

21. The cooling package wherein each via in each substrate comprises a diameter in a range of not less than 25 um to 150 um.

22. The cooling package further comprising a second cooling package, and each cooling package comprises a micro-module.

23. The cooling package further comprising a plurality of cooling packages stacked in series together to expand blocking voltage.

24. The cooling package further comprising a plurality of cooling packages that are configured to operate in parallel to expand operation current.

25. A cooling package for double-sided chips, the cooling package comprising:

a double-sided, bi-directional, junction transistor chip with an individual, double-sided, bi-directional power switch, or double-sided transistor assembly (collectively, a DSTA) sandwiched between heat sinks, each heat sink comprising a direct copper bonding (DCB) structure having opposed first and second copper layers on a substrate, and copper contacts that extend from a respective second copper layer through vias in each substrate to an exterior of the cooling package.

26. A cooling package for double-sided chips, the cooling package comprising:

a double-sided, bi-directional, junction transistor chip with an individual, double-sided, bi-directional power switch, or double-sided transistor assembly (collectively, a DSTA) sandwiched between heat sinks, each heat sink comprising a direct aluminum bond (DAB) structure having opposed first and second aluminum layers on a substrate, and aluminum contacts that extend from a respective second aluminum layer through vias in each substrate to an exterior of the cooling package.

27. A method of soldering a transistor, the method comprising:

(a) providing a double-sided, bi-directional, junction transistor chip, or double-sided transistor assembly (DSTA);

(b) mounting the DSTA in a die;

(c) print sintering Ag on first side pads of the DSTA;

(d) aligning a first side layer of a first heat sink to match a pattern of the first side pads on the DSTA;

(e) sintering the sintering Ag to convert the sintering Ag to pure Ag; and then (f) inverting the die and repeating steps (c) through (e) on second side pads of the DSTA and a second heatsink.

28. The method wherein each heat sink comprises a direct plating copper (DPC) structure.

29. The method wherein each heat sink comprises a direct copper bonding (DCB) structure.

30. The method wherein each heat sink comprises a direct aluminum bond (DAB) structure.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," "top," "bottom," and the like, may be used herein for ease of description to describe one element's or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated degrees or at other orientations) and the spatially relative descriptions used herein interpreted accordingly.

This written description uses examples to disclose the embodiments, including the best mode, and also to enable those of ordinary skill in the art to make and use the invention. The patentable scope is defined by the claims, and can include other examples that occur to those skilled in the art. Such other examples are intended to be within the scope of the claims if they have structural elements that do not differ from the literal language of the claims, or if they include equivalent structural elements with insubstantial differences from the literal languages of the claims.

In the foregoing specification, the concepts have been described with reference to specific embodiments. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of invention.

It can be advantageous to set forth definitions of certain words and phrases used throughout this patent document.

The term "communicate," as well as derivatives thereof, encompasses both direct and indirect communication. The terms "include" and "comprise," as well as derivatives thereof, mean inclusion without limitation. The term "or" is inclusive, meaning and/or. The phrase "associated with," as well as derivatives thereof, can mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items can be used, and only one item in the list can be needed. For example, "at least one of: A, B, and C" includes any of the following combinations: A, B, C, A and B, A and C, B and C, and A and B and C.

Also, the use of "a" or "an" is employed to describe elements and components described herein. This is done merely for convenience and to give a general sense of the scope of the invention. This description should be read to include one or at least one and the singular also includes the plural unless it states otherwise.

The description in the present application should not be read as implying that any particular element, step, or function is an essential or critical element that must be included in the claim scope. The scope of patented subject matter is defined only by the allowed claims. Moreover, none of the claims invokes 35 U.S.C. § 112(f) with respect to any of the appended claims or claim elements unless the exact words "means for" or "step for" are explicitly used in the particular claim, followed by a participle phrase identifying a function.

Benefits, other advantages, and solutions to problems have been described above with regard to specific embodiments. However, the benefits, advantages, solutions to problems, and any feature(s) that can cause any benefit, advantage, or solution to occur or become more pronounced are not to be construed as a critical, required, sacrosanct or an essential feature of any or all the claims.

After reading the specification, skilled artisans will appreciate that certain features which are, for clarity, described herein in the context of separate embodiments, can also be provided in combination in a single embodiment. Conversely, various features that are, for brevity, described in the context of a single embodiment, can also be provided separately or in any sub-combination. Further, references to values stated in ranges include each and every value within that range.

What is claimed is:

1. A cooling package for double-sided chips, the cooling package comprising:
  a double-sided, bi-directional, junction transistor chip with an individual, double-sided, bi-directional power switch (DSTA); and
  first and second heat sinks, wherein the first and second heat sinks are arranged on opposing sides of the DSTA such that the DSTA is sandwiched between the first and second heat sinks, each of the first and second heat sinks comprising (i) a direct plating copper (DPC) structure having opposed first and second copper layers on a substrate, and (ii) copper contacts that extend from the second copper layer through vias in the substrate to an exterior of the cooling package,
  wherein the DPC structures are symmetrical to one another across the DSTA.

2. The cooling package of claim 1, wherein the cooling package comprises one of a discrete power device, co-packed power device or multi-chip power module.

3. The cooling package of claim 1, further comprising a second DSTA that is identical to the DSTA, is packaged side-by-side with the DSTA, and is sandwiched between the first and second heat sinks.

4. The cooling package of claim 1, further comprising second, third and fourth DSTAs that are identical to the DSTA, are packaged side-by-side with the DSTA, and are sandwiched between the first and second heat sinks.

5. The cooling package of claim 1, further comprising asymmetrical temperature soldering on each side of the cooling package, wherein a first solder that is applied on one side has a higher melting temperature than a second solder applied on an opposite side after the first solder.

6. The cooling package of claim 5, wherein the first and second solders each comprise Ag.

7. The cooling package of claim 1, further comprising sintering Ag to bond the DSTA to the first and second heat sinks, and wherein the sintering Ag is converted to pure Ag during sintering.

8. The cooling package of claim 7, wherein each layer of pure Ag comprises a thickness of at least 1 mm to facilitate leads between inner planes of the first and second heat sinks.

9. The cooling package of claim 1, wherein the DSTA is configured to operate at an electrical current of at least 50 A with a parasitic resistance from the cooling package of less than 1 mOhm up to 100 kHz switching frequency.

10. The cooling package of claim 1, wherein the DSTA is configured to operate at a power of more than 60 kW.

11. The cooling package of claim 1, wherein the DSTA comprises a wafer thickness in a range of 40 um to 750 um.

12. The cooling package of claim 1, wherein the opposed first and second copper layers of each DPC structure comprises a solid copper outer layer on a respective substrate, and a patterned copper inner layer opposite the solid copper outer layer.

13. The cooling package of claim 12, wherein the patterned copper inner layer matches a pattern of a respective one of the DSTA.

14. The cooling package of claim 1, wherein each copper layer of the DPC structures comprises a thickness in a range of about 1 um to about 150 um to be compatible with various current flowing through the copper.

15. The cooling package of claim 1, wherein each copper layer of the DPC structure comprises a thickness in a range of greater than 75 um to about 150 um.

16. The cooling package of claim 1, wherein the substrate of the DPC structure comprises at least one of $Al_2O_3$, ZTA, AlN, silicon or BeO.

17. The cooling package of claim 1, wherein the DPC structure comprises a thermal resistance of about 0.001° C./watt to about 0.1° C./watt.

18. The cooling package of claim 1, further comprising molding compound or epoxy encapsulation between the DPC structures and surrounding the DSTA.

19. The cooling package of claim 1, wherein each DPC structure comprises a line pitch with line width/line space resolution as fine as 2 mil/2 mil.

20. The cooling package of claim 1, wherein each via in each substrate comprises a diameter in a range of not less than 25 um to 150 um.

21. The cooling package of claim 1, further comprising a second cooling package, wherein the cooling package and the second cooling package each comprise a micro-module.

22. The cooling package of claim 1, further comprising a plurality of cooling packages stacked in series together to expand blocking voltage.

23. The cooling package of claim 1, further comprising a plurality of cooling packages that are configured to operate in parallel to expand operation current.

24. A cooling package for double-sided chips, the cooling package comprising:

a double-sided, bi-directional, junction transistor chip with an individual, double-sided, bi-directional power switch (DSTA); and first and second heat sinks, wherein the first and second heat sinks are arranged on opposing sides of the DSTA such that the DSTA is sandwiched between the first and second heat sinks, each of the first and second heat sinks comprising (i) a direct copper bonding (DCB) structure having opposed first and second copper layers on a substrate, and (ii) copper contacts that extend from the second copper layer through vias in the substrate to an exterior of the cooling package, wherein the DCB structures are symmetrical to one another across the DSTA.

25. A cooling package for double-sided chips, the cooling package comprising:

a double-sided, bi-directional, junction transistor chip with an individual, double-sided, bi-directional power switch (DSTA); and first and second heat sinks, wherein the first and second heat sinks are arranged on opposing sides of the DSTA such that the DSTA is sandwiched between the first and second heat sinks, each of the first and second heat sinks comprising (i) a direct aluminum bond (DAB) structure having opposed first and second aluminum layers on a substrate, and (ii) aluminum contacts that extend from the second aluminum layer through vias in the substrate to an exterior of the cooling package, wherein the DAB structures are symmetrical to one another across the DSTA.

* * * * *